United States Patent [19]

Feldstein

[11] 4,131,699

[45] * Dec. 26, 1978

[54] METHOD OF PREPARATION AND USE OF ELECTROLESS PLATING CATALYSTS

[76] Inventor: Nathan Feldstein, 63 Hemlock Cir., Princeton, N.J. 08540

[*] Notice: The portion of the term of this patent subsequent to Sep. 13, 1994, has been disclaimed.

[21] Appl. No.: 820,904

[22] Filed: Aug. 1, 1977

Related U.S. Application Data

[63] Continuation-in-part of Ser. No. 625,326, Oct. 23, 1975, Pat. No. 4,048,354.

[51] Int. Cl.$^2$ .............................................. C23C 3/02
[52] U.S. Cl. ................................... 427/306; 427/304; 427/305; 106/1.11
[58] Field of Search ...................... 427/304, 305, 306; 106/1

[56] References Cited

U.S. PATENT DOCUMENTS

| | | | |
|---|---|---|---|
| 3,011,920 | 12/1961 | Shipley | 427/304 X |
| 3,206,408 | 9/1965 | Vitalis et al. | 252/140 X |
| 3,532,518 | 10/1970 | D'Ottavio | 427/304 X |
| 3,790,400 | 2/1974 | Kuzmik | 427/306 X |
| 3,854,952 | 12/1974 | Kenney | 252/313 R X |
| 3,904,792 | 9/1975 | Gulla | 427/304 X |
| 3,958,048 | 5/1976 | Donovan et al. | 427/306 X |
| 4,048,354 | 9/1977 | Feldstein | 427/306 X |

*Primary Examiner*—Ralph S. Kendall
*Attorney, Agent, or Firm*—Joel Spivak; Stanley Lieberstein

[57] ABSTRACT

A method for the formation of novel colloidal catalytic electroless plating compositions comprises admixing a highly stable non active (weakly active) colloidal dispersion with a reactivity modifier. The admixture so formed is used in electroless plating processes wherein a substrate is contacted with the novel colloidal catalytic composition, rinsed, contacted with a reducing or activating solution (which may be optional) and then contacted with an electroless plating solution.

51 Claims, No Drawings

METHOD OF PREPARATION AND USE OF ELECTROLESS PLATING CATALYSTS

Reference to Prior Application: This application is a continuation-in-part of U.S. application Ser. No. 625,326 filed on Oct. 23, 1975 now U.S. Pat. No. 4,048,354.

BACKGROUND OF THE INVENTION

In the plating of dielectric substrates by chemical (electroless) plating it is well known that suitable catalytic pretreatment is a prerequisite for effective electroless metal deposition. Such practices are well known and accepted in the art.

In examining the prior art for catalytic pretreatment it appears that while different procedures have been used, the incorporation of precious metals (e.g. palladium containing solutions) was common to all procedures. One catalytic system of particular interest is the two step process as disclosed in U.S. Pat. No. 3,011,920. In the process disclosed, a colloidal solution composed of tin(II) and precious metal salts, generally with hydrocholoric acid, is used. The effective catalyst is proposed to be a colloid of an elemental precious metal (e.g. palladium) stabilized by the excess stannous chloride present in the media. While the system disclosed in U.S. Pat. No. 3,011,920 has been quite popular in commercial practices, rising costs of precious metals and miscellaneous product reliability problems has led to the quest for new systems in which the use of precious metals, tin, as well as of the hydrochoric acid would be completely eliminated.

In meeting this objective it was found, as described in U.S. Pat. No. 3,993,799 filed by the applicant herein, that colloidal systems (metals, alloys and compounds) based upon non-precious metals could constitute the basis for new commercial plating processes. Based upon the teachings disclosed in U.S. Pat. Nos. 3,011,920 and 3,993,799, the metals which are catalytic to electroless plating are evident. More specifically, it was found that colloids of non-precious metals (preferably, but not limited to, selected from the group of copper, iron, cobalt, nickel and combinations thereof) may be used in the direct replacement of the tin/palladium colloid followed by a treatment in a suitable reducing media. In the reducing media, reduction of the ionic portion of adduct (or surface of colloid) derived through the adsorption from the colloidal media takes place, resulting in active nucleating sites capable of initiation of the electroless process. It is noted, however, that the reducing media can be deleted since most electroless plating baths contain at least one reducing agent. Accordingly, the present invention is applicable to both modes of processing.

In reviewing the teaching disclosed in U.S. Pat. No. 3,993,799, it is recognized that many of the inherent disadvantages associated with the palladium based catalysts are eliminated. It is further recognized that based upon practices in this art, it is essential that any catalytic system should maintain its properties especially with storage (e.g. several months) and shipment under conditions of substantial temperature fluctuations. It is thus highly desirable to have a media in which good colloidal stability would be maintained, and at the same time sufficient catalytic activity to be used in the plating process. I have generally observed that as one increases the stability, the activity is decreased thereby making it difficult to meet both requirements in a single system.

For example, I have observed that active plating colloids have generally shown a limited stability (for long term storage purposes) due to coagulation which takes place leading to precipitation, with change in particle size and distribution during the coagulation process. In addition, I have noted that highly stable colloidal dispersions have shown limited catalytic activity when used in accordance with U.S. Pat. No. 3,993,799 and moderate concentrations of reducing media or activating media. Similar trends were also noted in U.S. Pat. No. 3,948,048 on the interrelationship between reactivity and stability. In fact, in U.S. Pat. No. 3,958,048 some of the illustrated examples lost their colloidal character and became true solutions within 24 hours.

It is thus an objective of this invention to provide both stable and active colloidal dispersions which are useful in electroless plating processes as well as in other processes having the same prerequisites. While not wishing to be repetitious, the following are included herein by reference: U.S. Pat. Nos. 3,011,920, 3,993,799, 3,958,048, 3,993,491, 3,993,801, and Ser. No. 625,326.

SUMMARY OF THE INVENTION

A method for preparing a novel catalytic colloidal composition useful in electroless plating techniques comprises the step of admixing a highly stable non-active (weakly active) colloidal dispersion with a reactivity modifier. Novel catalytic colloidal compositions prepared as above comprise stable colloids of non-precious or precious metals admixed with a reactivity modifier. The final admixture is thus comprised of at least two distinct colloid stabilizers. The novel catalytic colloidal compositions are utilized in the electroless plating process which comprises the steps of treating a dielectric substrate with the active catalytic colloidal composition and then, when necessary, to further treat the substrate with a reducing or activating composition to provide additional active nuclei on the substrate surface, the activated substrate is then contacted with an electroless plating bath.

DETAILED DESCRIPTION OF THE INVENTION

The process of the present invention is applicable to the metallic plating of dielectric substrates by autocatalytic or as more commonly known, electroless plating. Such processes are well known in the art and they produce a wide variety of products varying from printed circuitry arrays, decorative plated plastics parts and magnetic tapes to metallized fibers.

The term "hydrous oxide" as used herein is intended to encompass the insoluble oxides and insoluble hydroxides of metals. The preferable hydrous oxides are selected from the group consisting of oxides and hydroxides of cobalt, nickel, iron and copper and mixtures thereof. Other suitable hydrous oxides include oxides and hydroxides of precious metals such as palladium, silver and others.

It is also recognized that metallic colloids, (e.g. colloids of copper and nickel as well as alloys thereof) due to their pyrophoric nature oxidize when in contact with air and water. Therefore, they are really metallic nuclei with an outer oxidized surface and thus are also considered herein as hydrous oxide colloids. In addition, colloidal metallic nuclei of precious metals, while they are more inert towards oxidation, are also suitable in the practice of the present invention.

The term "stabilizer" as used herein is intended to encompass substances which alter the characteristics of the colloid so as to prevent, delay, or minimize their coagulation and precipitation. It is believed that these stabilizers are adsorbed onto the surface of the colloids thereby altering the surface charge and hence their stability. Stabilizers contemplated by the present process and solution may include secondary colloids (gelatin), dispersants, surfactants, sugars and polyalcohols (glycerol).

The term "surfactant" (or surface active agent) as used herein generally refers to substances which are capable of lowering the surface tension of a liquid or the interfacial tension between two liquids. All useful surfactants possess the common feature of a water-soluble (hydrophilic) group attached to an organic (hydrophobic) chain. Surfactants as used herein are also intended to encompass detergents, dispersants and emulsifying agents regardless of whether or not they lower the surface tension of a liquid (e.g. water).

The term "reactivity modifier(s)" as used in the present invention generally refers to substances which while alone are generally inert in said plating process, promotes activation of the otherwise weakly active colloids in the plating process (the catalytic preparation). Such modifiers may be of organic or inorganic nature as well as combinations thereof. It should be recognized by those skilled in the art that the preferred reactivity modifier composition to be added and the quanitity thereof is best determined as a trial procedure for each stable colloid composition and/or substrate to be coated. Furthermore, it should be recognized that reactivity modifier(s) are also inherently colloid stabilizers. Thus, the selection for such potential members is endless and should be obvious to one skilled in the art in view of the present invention.

In general, the electroless plating process of the present invention comprises the steps of (1) contacting (priming) the substrate (preferably one which was previously cleaned and etched to promote adhesion) with a colloidal catalytic composition, (2) developing or activating the substrate further by contacting the substrate with a reducing agent (or activating agent) to form a discontinuous layer of the metal either in a reduced oxidation state or in a more activated or configuration state, thus forming the catalytic nuclei active for the initiation of the electroless plating. This step, however, may be optional, and (3) contacting the substrate with a compatible electroless plating formulation. In step (2) it is recognized that any of several chemical reactions may take place (e.g. dissolution or removal of some of the colloidal stabilizer(s)), all of which provide a more active site with shorter induction time for the electroless plating process. It is also noted that generally speaking rinsing between steps is considered good practice. In the above catalytic treatment, when employing colloidal dispersions comprising precious or nonprecious metals in their elemental state, or alloys or compounds of said metals, sufficient activation of the substrate may be accomplished at the priming step without requiring the additional activation with a separate reducing or activating composition prior to contacting the substrate with the electroless plating bath.

The following examples are illustrative of the concept of the present invention and are not to be taken as in limitation thereof; moreover, it should be obvious to those skilled in the art that further optimization is possible with respect to compositions and conditions indicated as having less than 100% coverage. Furthermore, it should be obvious that the present findings are not limited to the art of plating and they can be used in other commercial fields requiring novel properties of the colloids.

EXAMPLE 1

This example shows the general procedure of the novel electroless plating process. Acrylo-nitryl-butadiene-styrene (ABS) substrates (Monsanto PG Grey-299) were etched in a solution comprising 400 g/l $CrO_3$ and 350 g/l $H_2SO_4$(conc.) for about 10 minutes at 70° C. Thereafter, the etched substrates were immersed in a colloidal catalytic primer solution for about five minutes with said solution at 40° C. The primed substrates were then rinsed and immersed in a developer solution comprising 0.5 g/l $NaBH_4$ for a few minutes. The substrates were rinsed and then immersed in an electroless copper bath operating at 40° C. and having the following composition.

| | |
|---|---|
| $CuSO_4 \cdot 5H_2O$ | 15 g/l |
| EDTA (40%) | 68 cc/l |
| NaOH | 9 g/l |
| NaCN | 3 ppm |
| Tergitol TMN | 0.2 (% wt.) |
| $H_2CO$ (37%) | 22 cc/l |

Final colloidal catalytic primer dispersion (working media) were made by the dilution of premade concentrated stock; the latter was generally prepared via thermal aging or other equivalent conditions. While in these examples substrates were pre-cleaned and etched using a wet chemical technique, other techniques of performing the preferred etching which are of a dry nature may be substituted and used in accordance to the present invention. A stabilized colloid (291m) was prepared by the admixing of 12.2 g/l $Cu(NO_3)_2 \cdot 3H_2O$, 12.2 gr/l gelatine and sodium hydroxide in an amount representing twice the molar concentration of the copper ion. Prior to aging pH was adjusted to 9.0 and thereafter aging for about 16 hours was undertaken at 75° C.

| No. | Final Composition of Colloidal Catalytic Primer | Relative (%) Plating Coverage | |
|---|---|---|---|
| 1a | dilution (4×) of stock primer soln. with water | 0 | |
| 1b | Same as above with 0.025M sodiumlaurylsulfate | 100 | |
| 1c | Same as 1a with 0.025M sodiumdecylsulfate | 95 | (average) |

Using the same final composition of catalytic primer as in 1a and 1b but including 0.27 g/l of $NaBH_4$ gave a plating coverage of 0% and 75% for media 1a and 1b respectively. While visually compositions 1a and 1b appeared the same, examination by an electron microscope at 150,000x showed a major difference in appearance. Specifically, the resulting colloid 1b exhibited a finer particle size (almost an order of magnitude) compared to the colloids of 1a. Similar observations were also noted in other cases. While I do not wish to be bound by theory, it is conceivable that the enhanced reactivity may be in part due to this noted change in particle size distribution. It should thus be recognized in the optimization of the process and solutions, plating coverage is dependent upon the reducing media reactivity (e.g. concentration), nature and amount of added reactivity modifier, as well as the amount and nature of colloid stabilizer used in the preparation of the stabilized colloid as well as nature and reactivity of the electroless plating formulation.

EXAMPLE 2

It was also found that the present invention may be implemented in an alternative sequence of steps. For example, solutions and substrates were all the same as in Example 1 while the following key steps were undertaken.
1. Immersion in the colloidal catalytic media cited in Example 1, No. 1a followed by a water rinse; then
2. Immersion for 5 minutes in a surfactant solution composed of 0.025M sodium laurylsulfate at 40° C. and rinse; then
3. Immersion for 5 minutes in 0.5 g/l $NaBH_4$ and rinse; finally
4. Immersion in the electroless copper formulation.

Results showed 90% metallic coverage. While the process shown in this example requires more steps in comparison to the process shown in Example 1, its adaptation falls within the spirit of this invention. Using the above surfactant prior to the immersion into the stabilized colloidal solution did not produce any perceptible plating results.

EXAMPLE 3

Solutions, substrates and procedure were the same as in Example 1, except for the substitution of the following colloidal catalytic primer.

| No. | Final Working Composition of Colloidal Catalytic Primer | Relative (%) Plating Coverage |
|---|---|---|
| 3a | 3.1 g/l protective colloid* 0.005 M $Cu^{+2}$ pH final approx 9.0 | 0 |
| 3b | Same as above with 0.025M Sodium dodecylsulfate (reactivity modifier) | 90 |

*The protective colloid used is an extracted and refined collagen protein and is designated as Fluid Colloid EX-3 sold by the Swift Chemical Company. The concentrate stock dispersion was prepared under standard laboratory conditions.

EXAMPLE 4

Catalytic solutions were prepared by the admixing of cobalt sulfate, water, a material(s) selected from lingosulfonates (derivative of lingnin) and sodium hydroxide. In a typical case (41-4) the catalytic solution was comprised of

| $CoSO_4 . 7H_2O$ | 14.3 g/l |
|---|---|
| Lingosulfonate | 12.5 g/l |
| pH (after hydroxide addition and aging) | about 7.9 |

Dilution of above with water (1:9) and utilization in the present process steps (as defined in Example 1) gave good metallic coverage. Similarly, nickel and copper catalytic solutions are prepared using any of several soluble salts and hydroxides.

EXAMPLE 5

A procedure similar to Example 1 was used. However, sodium alpha sulfonate was used as the reactivity modifier. Results showed a major improvement in the plating coverage.

EXAMPLE 6 (JP-70)

A procedure similar to Example 1 was used. However, a commercial alkaline electroless copper bath comprising formaldehyde was used at room temperature. The weakly active (control JP-39) colloid comprised the admixture with some thermal energy added.

| $CuSO_4 . 5H_2O$ | 10.1 g/l |
|---|---|
| Gum Arabic | 12 g/l |
| $NaBH_4$ | 1.5 g/l |
| NaOH | 1.6 g/l |

Using the control followed by a rinse in 0.5 g/l $NaBH_4$ gave at best 50% metallic coverage. However, incorporating a sodium salt of polymerized alkyl naphthalene sulfonic acids at a concentration of 3.6 g/l to control resulted in 100% coverage.

EXAMPLE 7 (JP-84)

Control colloidal composition and procedure were the same as in Example 6. To control 4ml/l of absolute methanol was added as the reactivity modifier. Plating results after the incorporation of the reactivity modifier were 100% in coverage.

EXAMPLE 8 (CB-10)

A control (CB-10) colloidal composition comprising the admixture of:

| $CoCl_2 . 6H_2O$ | 2.4 g/l |
|---|---|
| $CuSO_4 . 5H_2O$ | 10.1 g/l |
| Gum Arabic | 12 g/l |
| $NaBH_4$ | 1.9 g/l |
| NaOH | 2.0 g/l |

The composition was mixed with added thermal energy.

0.96 g/l of dioctyl sodium sulfosuccinate was incorporated to the control. Using 0.3 g/l of dimethylamine borane (at 45° C. for 3 minutes) showed a significant improvement in the plating results. In this example I had found the the combination of copper and cobalt results in a reactivity level superior to either metals alone. Furthermore, I had found that the optimum cobalt to copper ratio must be determined for each individual composition; this can be accomplished by simple experiments obvious to those skilled in the art. In addition, while this phenomenon is not completely understood, it is anticipated that nickel and/or iron may be substituted for the cobalt since they are similar in their electronic structure.

In general it was found that an excess of copper to cobalt (or nickel) is preferred.

EXAMPLE 9

A colloidal dispersion of the admixture at a pH of 12.7 was prepared wherein the reaction was carried out above room temperature.

| $CuSO_4. 5H_2O$ | 9.96 g/l |
|---|---|
| $CoCl_2. 6H_2O$ | 2.38 g/l |
| NaOH | 7.52 g/l |
| $NaBH_4$ | 0.71 g/l |
| Sodium lingo sulfonate | 12.0 g/l |

The resulting dispersion was tested in accordance with the procedure of example 8. Results showed no plating. However, using the same composition with acid addition (e.g. sulfuric acid) to a final pH value of about 7.53 resulted in 100% metallic coverage. Accordingly, it should be recognized that pH adjustment(s) and, hence, those chemical additive(s) which are used to acheive said pH adjustment(s) are reactivity modifier(s) and their utilization falls within the spirit of this invention.

EXAMPLE 10

A composition similar to that in Example 9 at a pH of 7.47 with added 0.2 g/l of mercaptobenzothiazole was tested, followed by 0.1 g/l dimethylamine borane (at 45° C.) solution. Whereas the control plated 20% metallic coverage at best, the modified composition gave a plating coverage of 90 to 100%. The above testing was done at a pH of about 7.5.

It is noted that while in most cases the reactivity modifier was added after the colloid was formed, the invention is not limited to this sequence but is rather aimed at the final composition in which all the components including reactivity modifiers are present.

From the above variety of reactivity modifiers used, it should be evident that the invention is not intended to be limited to any specific chemical class, but rather includes all materials which function as either stabilizer and/or adsorbants onto the colloid nuclei.

While we do not wish to be bound by theory, the following model is proposed for possible account of the phenomenon at hand. In the formation of highly stabilized colloidal dispersions, the colloidal nuclei (e.g. hydrous oxide of copper) are surrounded by a stabilizer(s) which is adsorbed onto said nuclei. It is probably the degree of adsorption and its consequent charge modifications which contribute to the stabilization mechanism and at the same time makes the colloidal nuclei sterically impervious to the chemical reaction with subsequent reducing agent, or a key component within the electroless plating bath, especially when the latter are used in moderate reactivity (e.g., concentration of said reducing agent) required for economical plating processes.

Upon the transformation of the weakly active colloids, some removal of stabilizer(s) from the adsorbed layer takes place by a displacement reaction making the colloid nuclei more accessible to subsequent interaction with the reducing media and hence increasing its reactivity in the plating process. It also appears that in some cases the weakly active colloids are transformed to particles of smaller size.

It should be understood that although the term colloid stabilizer refers to various chemical compounds, the effectiveness of stabilizers is not necessarily the same; and thus a stabilizer in one system may be a reactivity modifier in another system.

Schematically, the following simple equilibira reaction may represent the present findings

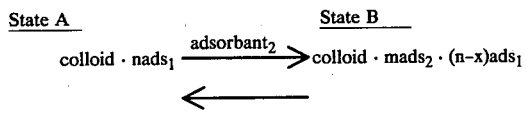

in which ads denotes adsorbant; n, m, x denotes some value.. Also $ads_1$ and $ads_2$ are chemically distinguishable. State A is a less reactive colloidal dispersion relative to State B. As aforesaid, the present invention is not bound to the proposed model and furthermore, in any of the states shown there may be more than one adsorbant as well as a multiplicity of colloids, having different metallic nature and/or morphology and/or of compounds and/or of alloys.

It should be recognized that the present invention is not limited to the nature or specific reducing agent used in the process of plating. Moreover, this invention is also not limited to the use of a reducing agent in the developing or activating step of the procedure. It should also be obvious to those skilled in the art that compatible electroless formulations should be selected.

It has also been recognized that in using the processes according to U.S. Pat. Nos. 3,993,799 or 3,993,491 or that of U.S. Pat. Nos. 3,772,056 and 3,772,078, some contamination into the reducing media would take place with time. The nature of the contamination may be either ionic or colloidal as well as combination thereof. It is further recognized that such contamination would tend to interact with the reducing media accounting for some undersired homogenous decomposition.

It is therefore highly desireable to insure that such homogenous decomposition catalyzed by metallic impurities be minimized. In meeting this objective it is proposed that selective additives in controlled concentrations be incorporated in the reducing media. Specifically, chelating (or complexing) agents should be incorporated for the complexion of metallic ions while strong colloidal stabilizers should be incorporated in the encapsulation of colloidal particles and hence result in their deactivation. It may further be necessary to add a combination of both types of materials. In introducing such materials (stabilizers), caution ought to be exercised in insuring that the reduction process is not disturbed. Thus, the concentration of said stabilizers should be controlled. The selection of potential colloid stabilizers should be evident from the present invention. For purposes of clarification, stabilizers incorporated in the reducing solutions are termed deactivators. Based upon the present teachings, it should be obvious that any of several electroless plating compositions may be substituted and used.

As heretofore pointed out, the modification of reactivity in accordance with the invention results in a substantial reduction of colloid particle size. This in and of itself has uses other than in electroless plating. (For example, as a thermal heat transfer composition which is particularly useful in solar energy convertors). The composition may be used with or without the added reactivity modifier.

What I claim is:

1. A process for electroless or chemical plating onto a non-conductor substrate comprises the step of contacting said substrate in an activated colloidal dispersion wherein said colloidal dispersion comprises a metal capable of electroless or chemical plating initiation and wherein said activated colloidal dispersion is derived from the admixing of a weakly active colloidal dispersion of said metal or alloy or compound of said metal containing a colloid stabilizer with a reactivity modifier thereby increasing the activity of said weakly active colloidal dispersion and wherein said colloid stabilizer and said reactivity modifier are different materials and further wherein said reactivity modifier is inherently a colloid stabilizer and thus said activated colloidal dispersion comprises of at least two colloidal stabilizers.

2. The process according to claim 1 wherein said weakly active colloidal dispersion is prepared by the nucleation of the insoluble phase in the presence of a secondary colloid.

3. The process according to claim 2 wherein said secondary colloid is a protein.

4. The process according to claim 1 wherein said electroless plating is of copper.

5. The process according to claim 1 wherein said electroless plating is of nickel.

6. The process according to claim 1 wherein said metal is selected from the group consisting of copper, cobalt, nickel, palladium and iron.

7. The process according to claim 6 further containing a metal selected from the group consisting of cobalt, nickel and iron, and further wherein the concentration of said copper is in excess to any of the other metal(s).

8. The process according to claim 1 wherein said metal is copper.

9. The process according to claim 8 further containing a metal selected from the group consisting of cobalt, nickel and iron.

10. The process according to claim 1 wherein said activated colloid is of negative charge.

11. The process according to claim 1 wherein said activated colloid is of positive charge.

12. The process according to claim 1 wherein said weakly active colloidal dispersion is prepared through the chemical interaction of the catalytic metals with soluble hydrides.

13. The process according to claim 1 further containing the step of activation.

14. The process according to claim 13 further containing the step of electroless metal deposition.

15. The process according to claim 1 further containing the step of metal deposition.

16. The process according to claim 1 wherein said reactivity modifier is selected from the group consisting of surfactants, alcohol, dispersants, mercapto-benzotriazole and its derivatives and soluble halides and mixtures thereof.

17. The process according to claim 1 wherein said reactivity modifier is capable of adsorbing onto the nucleus of the colloid.

18. The process according to claim 1 wherein said weakly active colloidal dispersion contains an hydrous oxide colloid.

19. The process according to claim 1 further containing the step of activation and wherein said activation is via a reduction step.

20. The process according to claim 1 wherein said non-conductor substrate is ABS.

21. The process according to claim 1 wherein said colloid stabilizer is gum arabic.

22. The process according to claim 1 wherein said colloid stabilizer is a soluble lignosulfonate.

23. The process according to claim 1 wherein said weakly active colloidal dispersion is derived through the nucleation reaction carried forth above room temperature.

24. The process according to claim 1 further containing the step of water rinsing.

25. The process according to claim 1 wherein said substrate is ABS.

26. The process according to claim 1 wherein the admixing of the weakly active colloidal dispersion with the reactivity modifier further resuits in a reduction of the colloid particle size distribution.

27. A process for electroless or chemical plating onto a non-conductor substrate comprises the step of contacting said substrate in an activated colloidal dispersion wherein said colloidal dispersion comprises a metal capable of electroless or chemical plating initiation and wherein said activated colloidal dispersion is derived from the admixing of a weakly active colloidal dispersion of said metal or alloy or compound of said metal containing a colloid stabilizer with an adsorbant thereby increasing the activity of said weakly active colloidal dispersion and wherein said colloid stabilizer and said adsorbant are different materials, and further wherein said adsorbant is capable of adsorbing onto said weakly active colloid.

28. The process according to claim 27 wherein said catalytic metal is selected from the group consisting of copper, cobalt, nickel, iron and palladium.

29. The process according to claim 27 wherein said activated colloid is of negative charge.

30. The process according to claim 27 wherein said activated colloid is of positive charge.

31. The process according to claim 27 wherein said weakly active colloidal dispersion is prepared by the nucleation of the colloid through the chemical interaction of a compound bearing said catalytic metal with a soluble hydride.

32. The process according to claim 27 further containing the step of metal deposition.

33. The process according to claim 27 wherein said substrate is ABS.

34. The process according to claim 27 wherein said colloid stabilizer is a soluble lignosulfonate.

35. The process according to claim 27 wherein said activated colloidal dispersion is of a metal.

36. The process according to claim 27 wherein said activated colloidal dispersion is of an alloy comprising a metal catalytic for electroless metal initiation.

37. The process according to claim 27 wherein said activated colloidal dispersion is of a compound comprising a metal catalytic for electroless metal initiation.

38. The process according to claim 27 wherein said weakly active colloidal dispersion was nucleated above room temperature.

39. The process according to claim 27 further containing the step of water rinsing.

40. The process according to claim 27 wherein said catalytic metal is copper and further contains a metal selected from the group consisting of cobalt, nickel and iron.

41. The process according to claim 40 wherein the concentration of copper is greater than the concentration of cobalt or nickel or iron.

42. The process according to claim 37 wherein the admixing of the weakly active colloidal dispersion with said adsorbant further results in a reduction in particle size distribution.

43. A process for electroless or chemical plating a non-conductor substrate which comprises the steps of:
   a. contacting said substrate with a colloidal dispersion wherein said colloidal dispersion comprises a metal capable of electroless or chemical plating initiation and wherein said dispersion is a dispersion of said metal or alloy or compound of said metal containing a colloid stabilizer and further said colloidal dispersion is highly stable weakly active when used alone in said process, and
   b. contacting the treated substrate with a composition comprising a reactivity modifier thereby increasing the activity of the treated substrate for said plating process and wherein said colloid stabilizer and said reactivity modifier are different materials.

44. The process according to claim 43 wherein said metal is selected from the group of copper, nickel, cobalt and iron.

45. The process according to claim 43 wherein said metal is copper and a metal selected from the group consisting of cobalt, iron and nickel.

46. The process according to claim 44 wherein said reactivity modifier is an acid.

47. The process according to claim 43 wherein said reactivity modifier is a chemical capable of adsorbing onto the weakly active colloid.

48. The process according to claim 43 wherein said reactivity modifier is a chemical capable of adsorbing onto the nucleus of the colloid.

49. The process according to claim 43 wherein said substrate is ABS.

50. The process according to claim 43 wherein said colloid stabilizer is a soluble lignosulfonate.

51. The process according to claim 43 wherein said plating is copper.

* * * * *